(12) United States Patent
Tsujimoto et al.

(10) Patent No.: US 7,846,289 B2
(45) Date of Patent: Dec. 7, 2010

(54) SHEET PEELING APPARATUS AND SHEET PEELING METHOD

(75) Inventors: Masaki Tsujimoto, Itabashi-ku (JP); Takahisa Yoshioka, Itabashi-ku (JP); Kenji Kobayashi, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 1030 days.

(21) Appl. No.: 11/587,854

(22) PCT Filed: Apr. 27, 2005

(86) PCT No.: PCT/JP2005/007950

§ 371 (c)(1), (2), (4) Date: Oct. 27, 2006

(87) PCT Pub. No.: WO2005/106937

PCT Pub. Date: Nov. 10, 2005

(65) Prior Publication Data

US 2007/0235131 A1   Oct. 11, 2007

(30) Foreign Application Priority Data

Apr. 28, 2004 (JP) .............................. 2004-133068
Jul. 27, 2004 (JP) .............................. 2004-218483

(51) Int. Cl.
*B32B 38/10* (2006.01)
(52) U.S. Cl. .................. 156/247; 156/344; 156/584
(58) Field of Classification Search ................. 156/344, 156/584, 247; 438/464, 976
See application file for complete search history.

(56) References Cited

U.S. PATENT DOCUMENTS 5,009,735 A * 4/1991 Ametani et al. ............. 156/241
5,891,298 A 4/1999 Kuroda et al.
6,200,402 B1 * 3/2001 Amo ........................ 156/235
6,616,799 B2 * 9/2003 Tsujimoto et al. ........... 156/344

FOREIGN PATENT DOCUMENTS

GB   2157193 A   10/1985

(Continued)

OTHER PUBLICATIONS

International Search Report of PCT/JP2005/007950 date of mailing Aug. 30, 2005.

*Primary Examiner*—Mark A Osele
(74) *Attorney, Agent, or Firm*—Westerman, Hattori, Daniels & Adrian, LLP

(57) ABSTRACT

A peeling apparatus 10 includes a peeling table 11 supporting a wafer W on which a sheet S is stuck and a sheet peeling unit 12 disposed above the peeling table 11, in which sheet S can be peeled off with relative movement of the sheet peeling unit 12 and the peeling table 11. The peeling apparatus 10 includes a support roll 20 of peeling tape PT, first and second rolls 30, 31 bonding the peeling tape PT to the sheet S surface, and a winding roll 21 of the peeling tape PT. Peeling-off is performed in a state of forming an initial peeling angle a1 such that a peeling tape PT is folded in an aperture C formed between the second roll 31 and the sheet S, and afterwards the sheet S is peeled off at subsequent peeling angle a2 corresponding to a diameter of the second roll 31.

8 Claims, 9 Drawing Sheets

FOREIGN PATENT DOCUMENTS

| | | | |
|---|---|---|---|
| JP | 63009122 A | * | 1/1988 |
| JP | 2000-091281 A | | 3/2000 |
| JP | 2001-319906 A | | 11/2001 |
| JP | 2002-124494 A | | 4/2002 |
| JP | 2002-332160 A | | 11/2002 |
| JP | 2003-338474 A | | 11/2003 |

* cited by examiner

SHEET PEELING APPARATUS AND SHEET PEELING METHOD

TECHNICAL FIELD

The present invention relates to a sheet peeling apparatus and a sheet peeling method, in particular, to a sheet peeling apparatus and a sheet peeling method suitable for peeling off a protection sheet which is stuck on a circuit plane of a semiconductor wafer.

BACKGROUND ART

Conventionally, when a semiconductor wafer (hereinafter, simply referred to as "wafer") is subjected to grinding process to make an ultra-thin semiconductor wafer, a protection sheet is generally stuck on a circuit plane side thereof, and the protection sheet is peeled off after completion of mounting step on a ring frame. Since the wafer is extremely thin, special attention is required when peeling off the protection sheet.

In patent documents 1 and 2, a peeling apparatus and a peeling method of a protection sheet described above are disclosed. The documents propose such an arrangement that a plurality of rolls are combined so as to ensure a large peeling angle and the protection sheet can be peeled in a direction as parallel as possible relatively to a surface of the wafer, and thereby cracks or the like on the wafer are prevented.

[Patent document 1] Japanese Patent Application Laid-Open No. 2001-319906

[Patent document 2] Japanese Patent Application Laid-Open No. 2000-91281

DISCLOSURE OF THE INVENTION

Problems to be Solved by the Invention

However, projecting portions 100 as shown in FIG. 9 for instance, which are called solder bumps (hereinafter, referred to as "bump") for ensuring electrical conductivity to a circuit plane side of a chip, are formed on a circuit plane side of a wafer W, and when such wafer W with bumps, and a protection sheet S being stuck thereon, is an object to be peeled off (hereinafter, simply referred to as "peeling object"), the peeling apparatus and the peeling method according to the patent documents are arranged in such a way that an initial peeling angle a1 is an angle in the vicinity of 180 degrees, and thereby peeling-off can be performed with no stress incurred to the wafer W, while the protection sheet S is peeled off in a state that the initial peeling angle a1 is maintained throughout the peeling process. Therefore, such a disadvantage occurs that adhesive 101 of the protection sheet S remains among the projecting portions 100.

Also, in the sheet peeling apparatus disclosed in the patent documents, a peeling roll sticks a peeling tape on the wafer surface, while rotating and imparting press force to the wafer surface. Thereafter, the roll peels off the sheet while pressing the wafer surface in a similar way. Thus, peeling resistance of the sheet as well as the press force are simultaneously exerted, which induces a load to the wafer and results in a disadvantage to cause damages to the wafer.

OBJECT OF THE INVENTION

The present invention has been proposed in view of the above disadvantages. An object of the present invention is to provide such a sheet peeling apparatus and a sheet peeling method that an initial peeling angle, which tends to be a cause of cracks or the like on a peeling object such as a wafer or the like, is set specifically when starting to peel off a sheet, and thereafter, the sheet can be peeled off through carrying on a subsequent peeling angle that is smaller than the initial one, and thus remaining of the adhesive portions can be prevented even in the presence of projecting portions such as bumps or the like.

Also, another object of the present invention is to provide a sheet peeling apparatus and a sheet peeling method, in which, when the sheet is peeled off, the sheet on the peeling object can be peeled off in a state that a load to the peeling object such as a wafer or the like is suppressed to a minimum.

Means for Solving the Problems

To achieve the objects, the present invention is arranged so that a sheet peeling apparatus includes a peeling table supporting a peeling object to which a sheet is stuck, and a sheet peeling unit provided to be movable relatively along a surface of the peeling object, in which the sheet can be peeled off in such a way that a peeling tape paid out from the sheet peeling unit is bonded to the sheet and the peeling tape is wound, wherein:

the peeling unit includes a supply portion of the peeling tape, a winding portion of the peeling tape and a peeling head positioned between the supply portion and the winding portion; wherein the peeling head folds the peeling tape in a direction to invert the peeling tape at a position of an end portion of the peeling object and forms an initial peeling angle that fits a peeling direction along the surface of the peeling object, meanwhile winding operation of the folded peeling tape forms a subsequent peeling angle that is smaller than the initial peeling angle and thereby peeling-off of the sheet can be achieved.

Also, the present invention is arranged so that a sheet peeling apparatus includes a peeling table supporting a peeling object to which a sheet is stuck; and a sheet peeling unit provided to be movable relatively along a surface of the peeling object, in which the sheet can be peeled off in such a way that a peeling tape paid out from the sheet peeling unit is bonded to the sheet and the peeling tape is wound, wherein:

the sheet peeling unit includes a supply portion of the peeling tape, a first roll bonding the peeling tape to a surface of the sheet, a second roll forming an aperture between the sheet and the second roll at a position where the first roll is bonded to the sheet, and a winding portion of the peeling tape;

the peeling tape between the first roll and the second roll is partially loosened and folded in a direction to invert the peeling tape between the second roll and the sheet, enabling to form an initial peeling angle; and it is arranged that peeling-off of the sheet can be performed with the second roll at a subsequent peeling angle that is smaller than the initial peeling angle, after the sheet is peeled off at the initial peeling angle.

In the sheet peeling apparatus, the peeling object may be a semiconductor wafer and the sheet may be a protection sheet to protect a surface of the semiconductor wafer.

Further, the present invention is arranged so that a sheet peeling apparatus includes a peeling table supporting a semiconductor wafer that includes bumps on a circuit plane thereof and a sheet stuck on the circuit plane, and a sheet peeling unit disposed above the peeling table and provided to be movable relatively along a sheet sticking face of the semiconductor wafer, in which the sheet can be peeled off in such a way that a peeling tape paid out from the sheet peeling unit is bonded to the sheet and the peeling tape is wound, wherein:

the sheet peeling unit includes a supply portion of the peeling tape, a first roll bonding the peeling tape to a surface of the sheet, a second roll forming an aperture between the sheet and the second roll at a position where the first roll is bonded to the sheet, and a winding section of the peeling tape;

the peeling tape between the first roll and the second roll is partially loosened and folded in a direction to invert the peeling tape between the second roll and the sheet enabling to form an initial peeling angle; and the sheet can be peeled off with the second roll at a subsequent peeling angle that is smaller than the initial peeling angle, after the sheet is peeled off at the initial peeling angle.

The present invention may be arranged so that the sheet peeling apparatus further includes a distance adjusting unit to adjust a relative distance between the peeling head and the peeling table, wherein:

the distance adjusting unit, when the peeling head performs initial peeling-off by moving the sheet from the end portion of the peeling object to an inner side thereof, maintains the peeling head at substantially the same relative distance as a distance set when the peeling head sticks the peeling tape on the sheet, and meanwhile, during the time between the completion of the initial peeling-off and the completion of the total peeling-off, the relative distance is enlarged to maintain the peeling head in a direction to separate from the peeling object.

Furthermore, a sheet peeling method according to the present invention is arranged so that a peeling tape is bonded to a sheet stuck on a surface of a peeling object so as to peel off the sheet comprising the steps of:

bonding the peeling tape to the sheet;

forming an initial peeling angle through bending the peeling tape in a direction to invert the peeling tape at a position of an end portion of the peeling object;

peeling off an end portion of the sheet from the end portion of the peeling object at the initial peeling angle; and peeling off the sheet while maintaining a subsequent peeling angle that is smaller than the initial peeling angle.

Still further, in the sheet peeling method, the peeling object may be a semiconductor wafer and the sheet may be a protection sheet to protect a surface of the semiconductor wafer.

Still furthermore, a sheet peeling method according to the present invention may be arranged so that a sheet is stuck on a circuit plane of a semiconductor wafer having bumps formed thereon and a peeling tape is stuck to the sheet to peel off, comprising the steps of:

bonding the peeling tape on a position of an end portion of the wafer;

providing the peeling tape with tension force at a pay-out side in a direction opposite to a winding direction, while winding operation of the peeling tape is suspended;

forming an initial peeling angle through gradually paying out the peeling tape at a pay-out side to generate a slack and bend the peeling tape in a direction to invert the peeling tape; then winding the peeling tape at the initial peeling angle to peel off an end portion of the sheet; and subsequently, peeling off the sheet at a subsequent peeling angle that is smaller than the initial peeling angle by winding the folded part.

The peeling method may adopt a method in which the peeling head, in a state of maintaining a relative distance to impart a press force to the peeling object when sticking the peeling tape on the sheet, winds the peeling tape to perform an initial peeling-off of the sheet; and subsequently, the sheet is completely peeled off from the peeling object, in a state that the relative distance is enlarged to separate the peeling head from the peeling object.

EFFECT OF THE INVENTION

According to the present invention, the initial peeling angle is set so as to be along the sheet surface as closely as possible, and thereafter the peeling angle is set to be smaller to perform peeling-off. Therefore, even when projecting portions such as bumps or the like exist on a surface where the sheet is stuck, the sheet can be peeled off without remaining an adhesive among the projecting portions.

Moreover, when the sheet is peeled off from the peeling object, such an arrangement can also be adopted that a press force is imparted only in the initial peeling-off stage and thereafter peeling-off can be performed in a state of released condition of press force to the peeling object until the peeling-off is completed. Accordingly, compared to a case where the sheet is peeled off with the press force continuously imparted to the peeling object, a load to the peeling object can be lessened. Therefore, even when the peeling object is a fragile member such as a wafer or the like, damage to the peeling object can be prevented more effectively.

EXPLANATION OF CODES 10 sheet peeling apparatus
11 peeling table
12 sheet peeling unit
22 peeling head
24 cylinder (distance adjusting unit)
W semiconductor wafer (peeling object)
S protection sheet
PT peeling tape
a1 initial peeling angle
a2 subsequent peeling angle

BEST MODE FOR CARRYING OUT THE INVENTION

Hereinafter, an embodiment of the present invention will be described with reference to the drawings.

Figure 1:
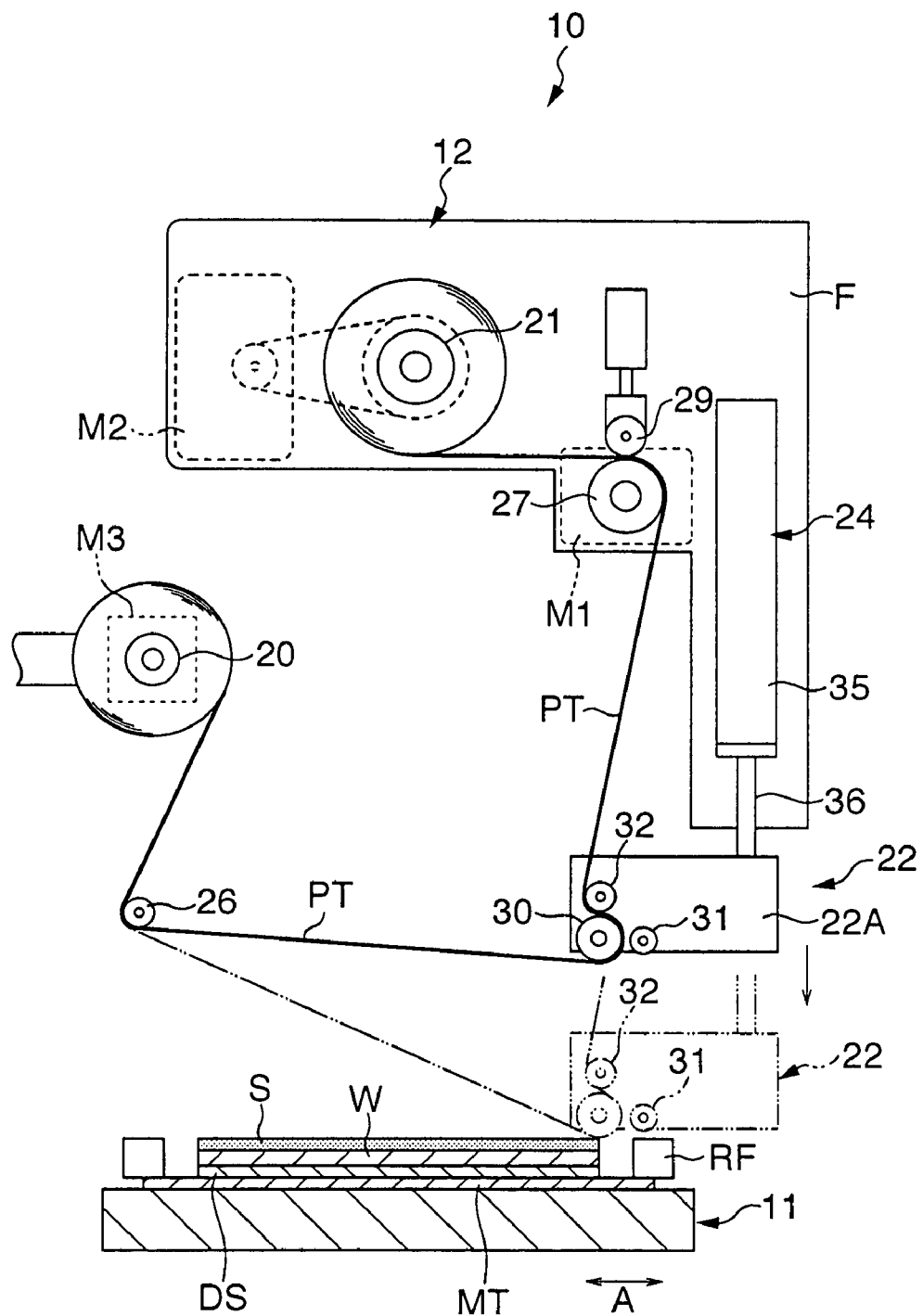
FIG. 1 is a front view schematically showing a sheet peeling unit.

FIG. 1 is a front view schematically showing a sheet peeling apparatus according to an embodiment of the present invention. In FIG. 1, a sheet peeling apparatus 10 is arranged to include a peeling table 11 which supports a wafer W as a peeling object and a sheet peeling unit 12 which is relatively disposed on an upper side of the peeling table 11.

The wafer W is supported, not limited in particular though, by a ring frame RF via a mount tape MT and a die bonding sheet DS and a protection sheet S is stuck on a circuit plane side of the wafer W (upper face side in FIG. 1). The protection sheet S is stuck thereon via ultraviolet curing adhesive in the embodiment, not limited in particular though.

The peeling table 11 is arranged to be movable in a direction of an arrow A shown in FIG. 1 via a guide rail or the like, and to have a number of sucking holes on the upper face side (wafer supporting face side) enabling to suck and support the wafer W as a peeling object via the mount tape MT and the die bonding sheet DS. The peeling table 11 may also be arranged to have a porous member to suck and support the wafer W as a substitution for providing sucking holes.

The sheet peeling unit 12 peels off the protection sheet S from the wafer W supported by the peeling table 11. The sheet peeling unit 12 is arranged to include a support roll 20 that is positioned above the peeling table 11 and composing a supply unit of a peeling tape PT; a winding roll 21 provided within a region of a plate-shaped frame F and composing a winding section of the peeling tape PT; a peeling head 22 that bonds the peeling tape PT to an end portion of the protection sheet S by imparting a predetermined press force and also peels off the protection sheet S from the wafer W by winding the bonded peeling tape PT; a cylinder 24 as a distance adjusting unit which moves the peeling head 22 vertically in a direction farther from/closer to the peeling table 11; a guide roll 26 provided between the peeling head 22 and the support roll 20; a drive roll 27 fixed to an output shaft of a motor M1 imparting a winding force of the peeling tape PT; a pinch roll 29 pinching the peeling tape PT between the drive roll 27 and the same; and a motor M2 which is rotationally driven in a direction of winding the winding roll 21. The support roll 20 is connected to an output shaft of a motor M3, and thus, a rotating force is imparted in a direction opposite to a pay-out direction of the peeling tape PT to apply a small tension to the peeling tape PT. In the embodiment, the peeling table 11 is provided to move in a horizontal direction in stead of moving the frame F horizontally, but the frame F may be provided to be relatively movable in a horizontal direction with respect to the peeling table 11.

The peeling head 22 is arranged to include a head body 22A; a first roll 30 that is supported by the head body 22A and bonds the peeling tape PT imparting a predetermined press force to a upper face of the end portion of the protection sheet S; a second roll 31 provided closely at the side of the first roll 30 with a space through which the peeling tape PT can pass; and a third roll 32 disposed on an upper side of the first roll 30. The second roll 31 has a smaller diameter than the first roll 30. When the peeling tape PT wound on the first roll 30 comes into contact with the protection sheet S, the second roll 31 is disposed at a height position so that an aperture C (refer to FIG. 4(A)) can be formed with respect to a surface of the protection sheet S. Therefore, it is arranged so that an initial peeling of the protection sheet S can be performed in a state where an initial peeling angle a1 (refer to FIG. 4(C)), which is described later, is formed. Moreover, the third roll 32 serves as a guiding roll to guide the peeling tape PT.

The cylinder 24 composing the distance adjusting unit is arranged to include a cylinder body 35 supported by the frame F and a piston rod 36 that extends downward from the cylinder body 35 and has the head body 22A fixed at a lower end portion thereof. In peeling-off, the cylinder 24 is arranged to maintain a relative distance between the peeling head 22 and the peeling table 11 such that the piston rod 36 is extended to press and bond the peeling tape PT to the upper side face of the end portion of the protection sheet S with the first roll 30.

Next, a sheet peeling method according to the embodiment will be described.

Figure 2:
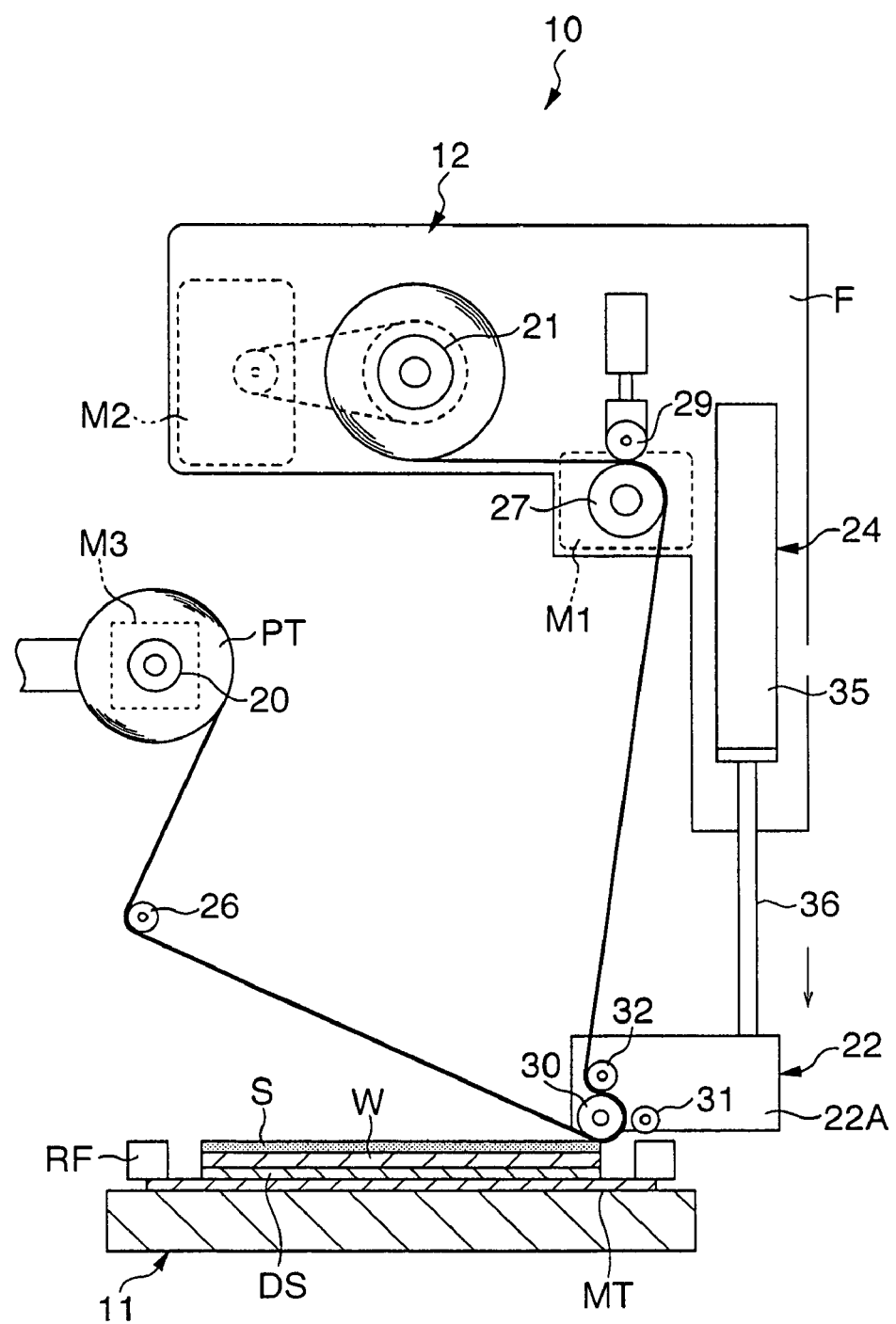
FIG. 2 is a front view schematically illustrating an initial step of sheet peeling-off operation with a sheet peeling unit.
Figure 4A:
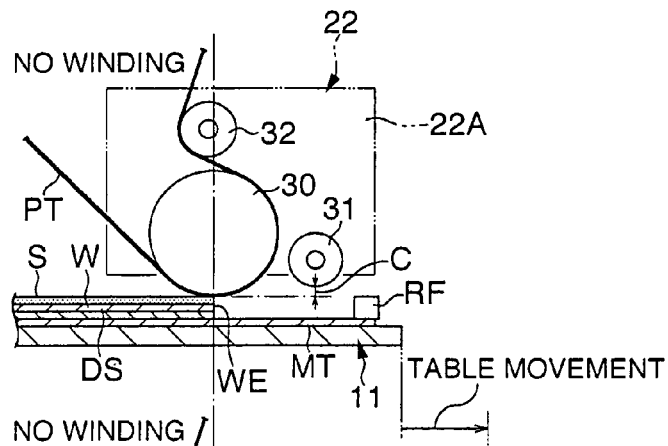
FIGS. 4(A) to (D) are explanatory diagrams illustrating the operation of the sheet peeling apparatus.
Figure 4B:
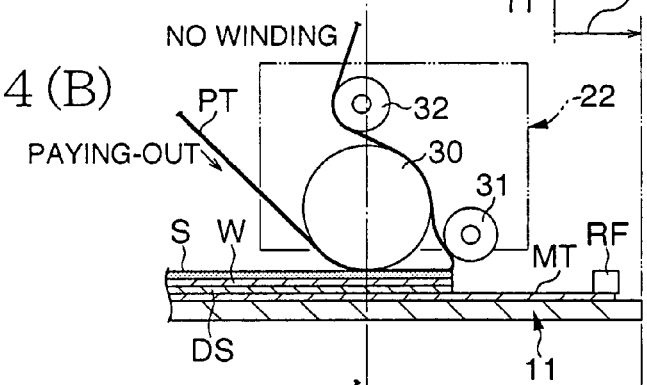

The wafer W mounted to the ring frame RF through the die bonding sheet DS is irradiated with ultraviolet rays in advance to cure an ultraviolet curing adhesive of the protection sheet S. Then, as shown in FIG. 2 and FIG. 4(A), the peeling head 22 is lowered to bond the lowest part of the first roll 30 and an end portion WE of the wafer W to each other. While the winding motor M2 is kept in a stopped state, and on the other hand, the support roll 20 is rotatably urged in the direction opposite to the pay-out direction of the peeling tape PT to an extent of imparting a tension to the peeling tape PT with a small force.

When the peeling table 11 is relatively moved in the right side in FIG. 4 with respect to the peeling head 22, the peeling tape PT is paid out corresponding to the movement, but at this point, the winding motor M2 is kept in the stopped state. Therefore, a bent portion is formed at the peeling tape PT (refer to FIG. 4(B)).

Figure 4C:
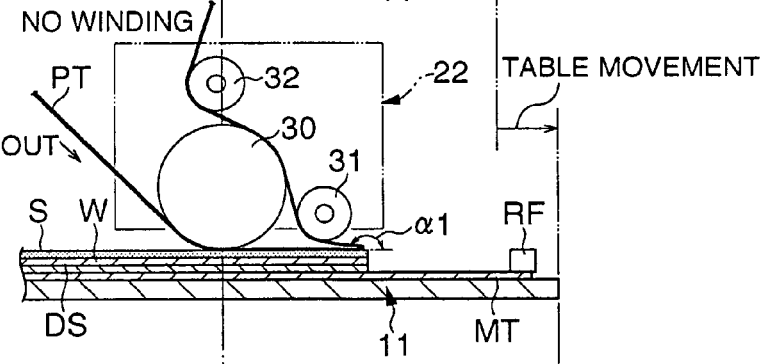

As shown in FIG. 4(C), when the bent portion formed on the peeling tape PT is inserted into the aperture C, an initial peeling angle a1 is formed. Steps of FIG. 4(A) to (C) may be repeated 2 or 3 times in order that the initial peeling angle a1 is reliably formed.

Figure 3:
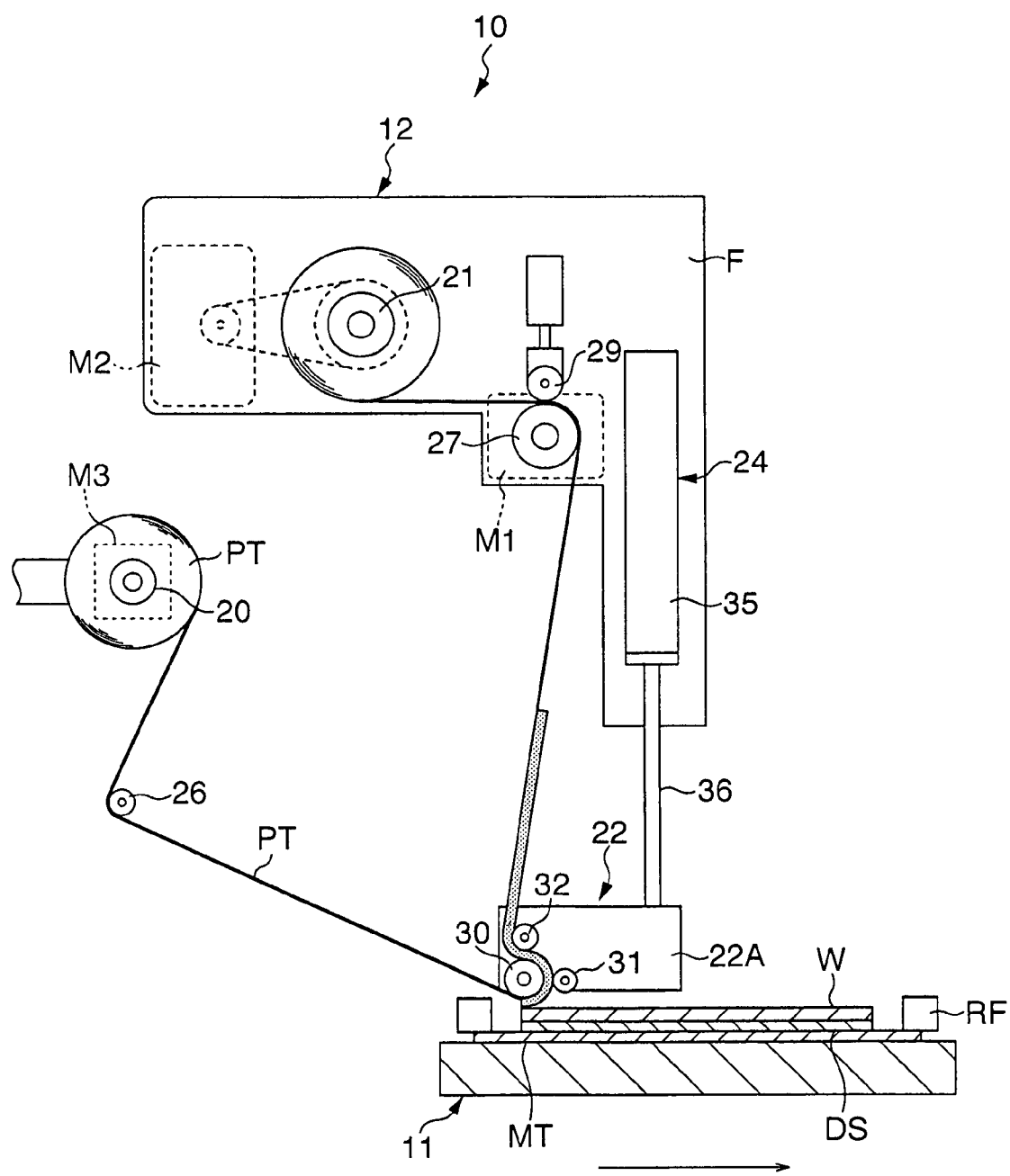
FIG. 3 is a front view schematically illustrating a final step of sheet peeling-off operation.
Figure 4D:
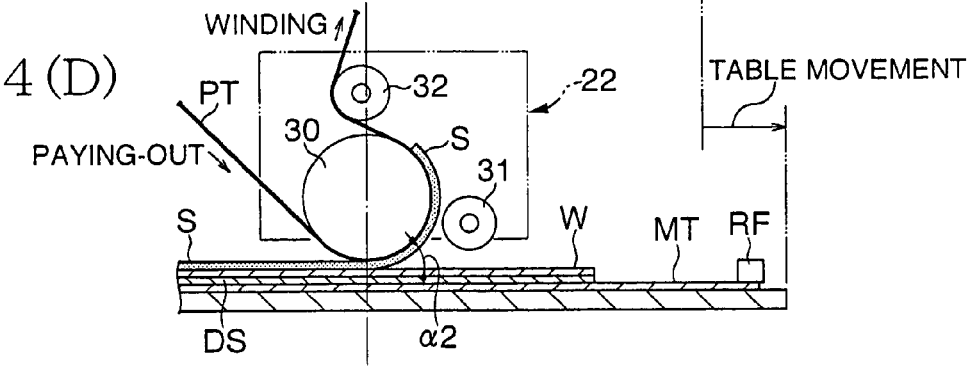
Figure 5:
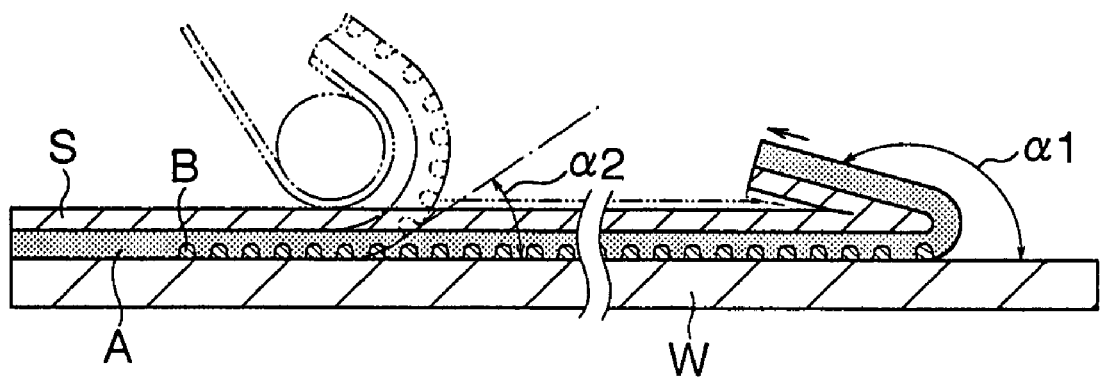
FIG. 5(A) is a sectional view showing an initial peeling angle and a subsequent peeling angle to peel off the sheet and FIG. 5(B) is an enlarged sectional view of a wafer including bumps after completion of peeling off a sheet.
Figure 5:
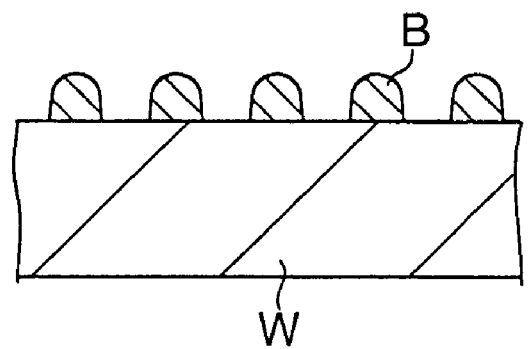

When the initial peeling angle a1 is formed, the motor M1 is driven so that the peeling tape PT tightly fits along an outer peripheral surface of the first roll 30 (refer to FIG. 4(D)). As described above, in a state where the peeling tape PT tightly fits along the outer peripheral surface of the first roll 30, a subsequent peeling angle a2 which is determined by a diameter of the roll (refer to FIG. 5(A)) is maintained and the protection sheet S is peeled off to the opposite side end portion of the wafer W (refer to FIG. 3). FIG. 5 illustrates a case where bumps B are formed on the circuit plane of the wafer W. When the protection sheet S is provided on the bumps B, an adhesive A existing among the bumps B is pulled out to an upper side thereof by the subsequent peeling angle a2. Owing to the action, the adhesive A can be peeled off in a state of being stuck on the protection sheet S without being left on the wafer W. Even when there is no bump on the wafer W a peeling-off is started at the initial peeling angle a1. Thus, even if the subsequent peeling angle a2 becomes smaller than the initial peeling angle a1, stress generating cracks or the like on the wafer W is not applied. This is due to the fact that, when a sheet stuck on a thin plate material such as the wafer is peeled off, the initial peeling angle is the most crucial one and the subsequent peeling angle after the peeling-off is started has a lower influence as a factor to generate cracks or the like. Then, the protection sheet S which has been UV-cured in an initial step is peeled off from the wafer circuit plane by the sheet peeling apparatus 10.

As described above, according to the embodiment of the present invention, especially even when the protection sheet stuck on the circuit plane side including the bumps B thereon is peeled off, the initial peeling-off is performed at the large peeling angle so that the protection sheet is fit along the wafer surface direction as closely as possible, resulting in the prevention of the stress to the wafer. After the completion of the initial peeling-off, the protection sheet is peeled off at the subsequent peeling angle a2 which is made relatively smaller. Thus, the adhesive A existing among the bumps B is subjected to peeling force by which the adhesive A is pulled out to a direction substantially directly above the wafer W surface. Thereby, it is possible to prevent the adhesive A of the protection sheet S from remaining among the bumps B.

As described above, the best arrangement, method and the like for carrying out the present invention have been disclosed in the forgoing description. However, the present invention is not limited to the above.

That is, although the present invention has been mainly illustrated and described about specific embodiments, it is possible for ones skilled in the art, if necessary, to add various modifications to shape, position, disposition or the like with respect to the above-described embodiments without departing from the scope of the technical idea and object of the present invention.

Figure 6:
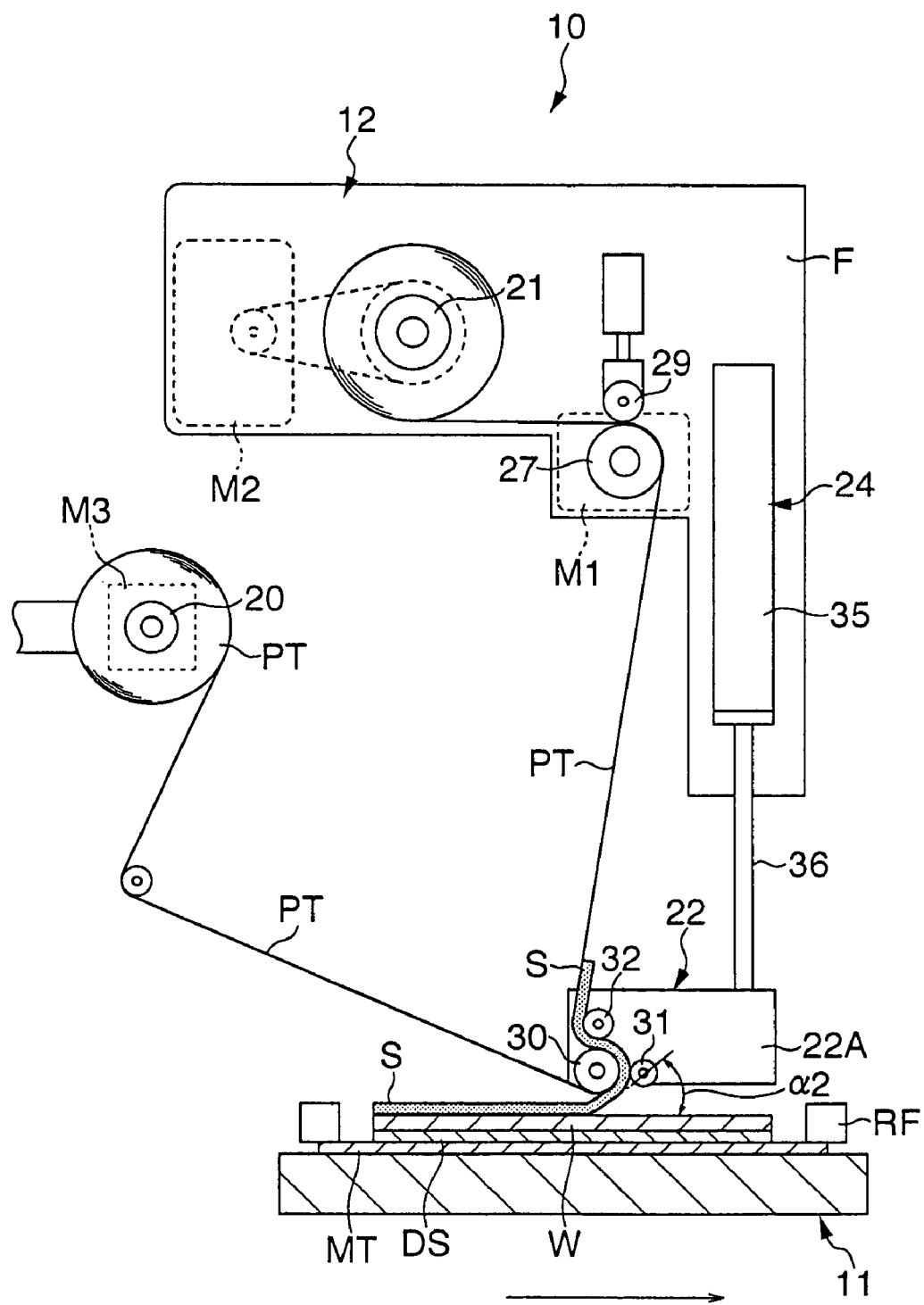
FIG. 6 is a front view schematically showing a sheet peeling apparatus illustrating a modification example on the way of the operation.
Figure 7:
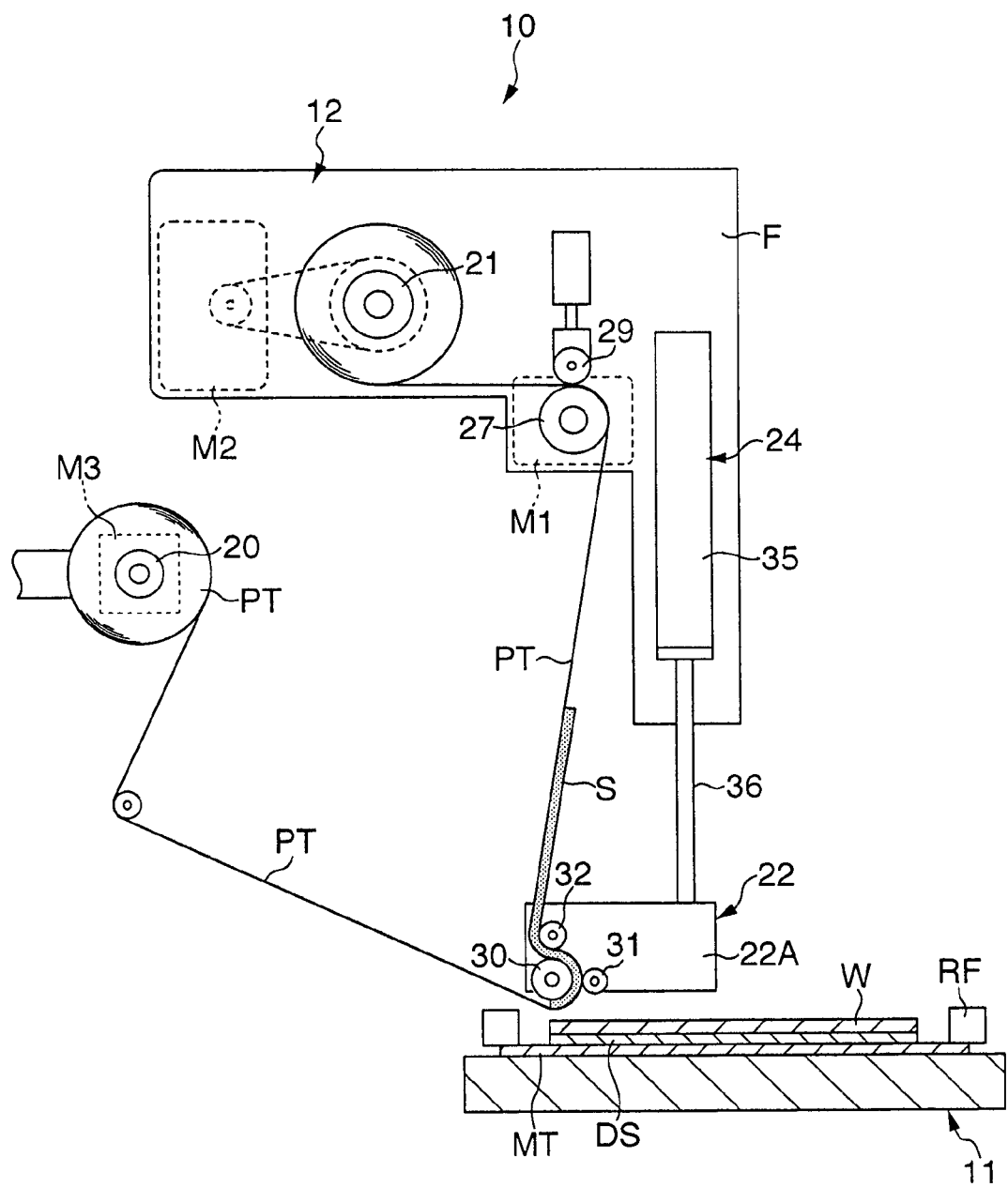
FIG. 7 is a front view schematically showing a sheet peeling apparatus related to a modification example illustrating a state after the sheet is completely peeled off from the wafer.
Figure 8:
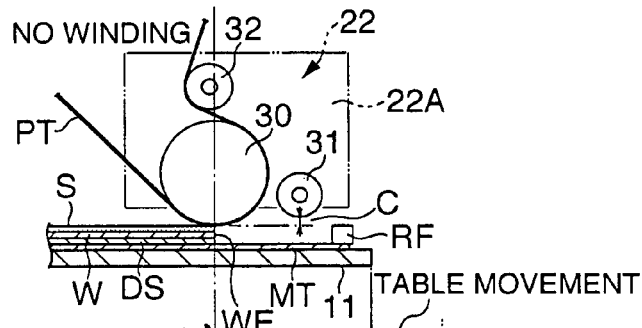
FIGS. 8(A) to 8(E) are explanatory views illustrating the operation of the sheet peeling apparatus related to a modification example.
Figure 8:
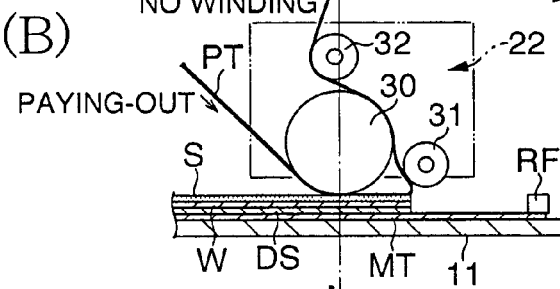
Figure 8:
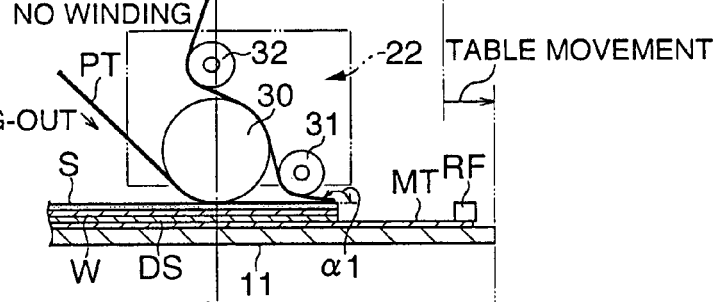
Figure 8:
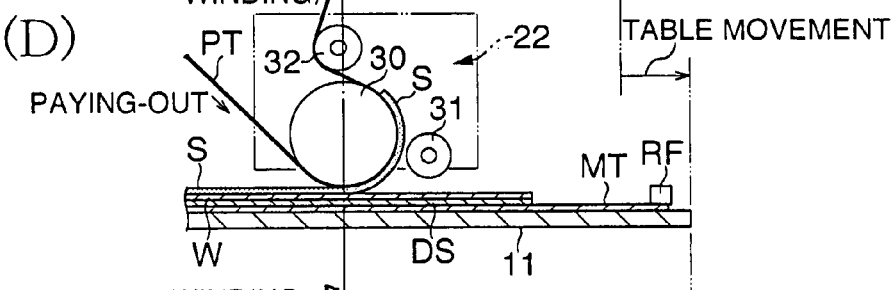
Figure 8:
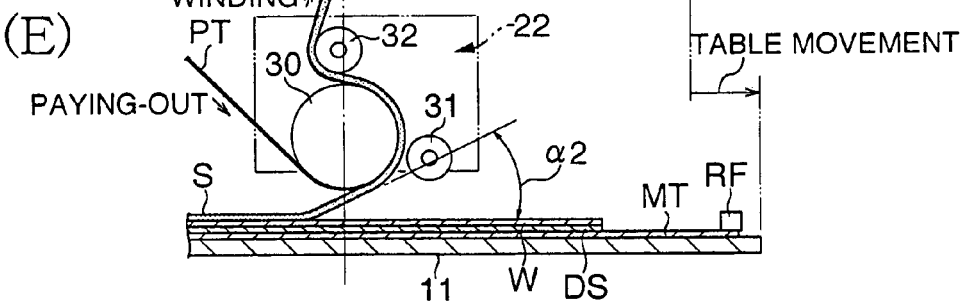
Figure 9:
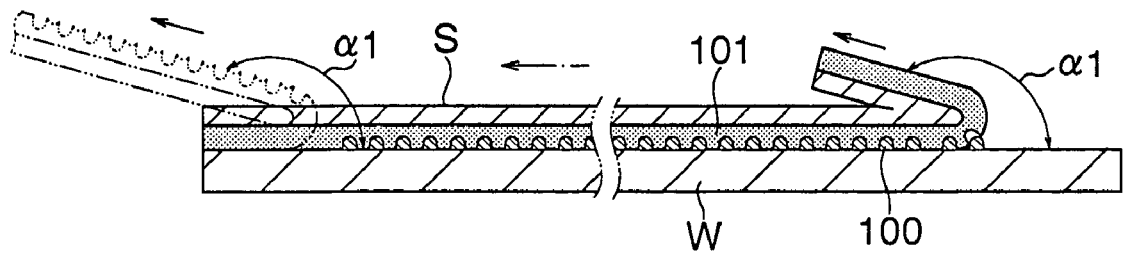
FIG. 9(A) is a sectional view schematically illustrating a case where a sheet stuck to a wafer with bumps is peeled off by a conventional peeling apparatus.
FIG. 9(B) is a partially enlarged sectional view of FIG. 9(A)
FIG. 9(C) is an enlarged sectional view illustrating a state after the completion of sheet peeling off.
Figure 9:
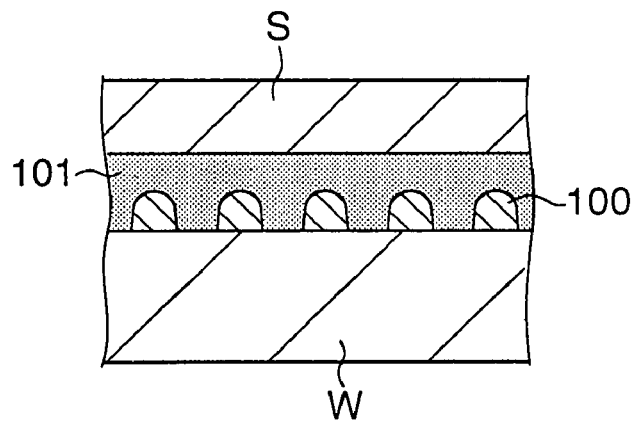
Figure 9:
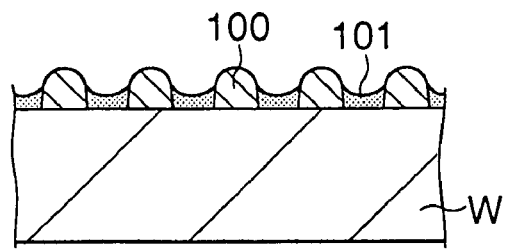

For instance, in the embodiment, the first roll 30 is arranged so as to perform peeling-off from the initial peeling-off to the completion of the peeling-off, maintaining a state of being in contact with the wafer surface, but the present invention is not limited to it. For instance, it is possible to perform peeling-off as shown in FIG. 6 through FIG. 8. That is, in the initial peeling-off, the piston rod 36 of the cylinder 35 is extended to hold a relative distance between the peeling head 22 and the peeling table 11 such that the peeling tape PT is pressed and bonded to the upper side face of the end portion of the protection sheet S with the first roll 30. Meanwhile, during the time between the initial peeling-off completion and the total peeling-off completion, the relative distance is enlarged so as to maintain a state where the first roll 30 is moved to the upper side away from the wafer W. Thus, it is possible to form the subsequent peeling angle a2 and perform the peeling-off.

That is, when the peeling tape PT tightly fits along the outer peripheral surface of the first roll 30 (refer to FIG. 8(D)), or, in a state right before this state, the cylinder 24 is driven to lift the peeling head 22 and the first roll 30 can be held at a position lifted from the wafer W so as to separate from the sheet S. The subsequent peeling angle a2 (refer to FIG. 6, FIG. 8(E)) is formed by this relative distance or the like. In a state of maintaining the angle a2, the peeling table 11 is moved rightwards while a motor M1 is driven. Thus, the protection sheet S is completely peeled off from the surface of the wafer W (refer to FIG. 7).

In peeling-off according to the subsequent peeling angle a2, the stress of generating cracks or the like on the wafer W is not applied associated with release of the press force by the first roll 30. When bumps are formed on the wafer circuit plane, the subsequent peeling angle a2 and a position to which the first roll 30 is lifted are interacted and the adhesive existing among the bumps is pulled out to the upper side more strongly. Thus, it is possible to peel off the protection sheet S without remaining the adhesive on the wafer W.

When such a modification is applied, compared to a case where the protection sheet S is peeled off with a press force continuously imparted to the wafer W, a load to the wafer W can be reduced. Accordingly, even when the protection sheet S is stuck to a fragile member such as the wafer or the like and the protection sheet is to be peeled off from the wafer W, damages to the wafer W can be prevented.

In the embodiment, the cylinder 24 is arranged to adjust a position of the peeling head 22 in the vertical direction, but a cylinder to move the peeling table 11 in the vertical direction may be provided at the side of the peeling table 11. Further, the peeling tape PT is not limited to a continuous strip-shaped tape, but a sheet-shaped tape can be used. In this case, it is possible to comply with the modification by providing with a supply unit for the sheet-shaped peeling tape to the peeling head 22.

Moreover, the peeling head 22 in the embodiment is not limited to the illustrated example of the arrangement, but if the peeling tape PT is moved to be folded so as to form the initial peeling angle, and afterwards, the subsequent peeling angle can be formed, any arrangement can be acceptable. Also, the initial peeling angle a1 can be determined within a range where damage such as cracks or the like are not incurred to the peeling object when the protection sheet S is peeled off from the end portion of the peeling object such as the wafer W or the like. The subsequent peeling angle a2 can be determined within a range where the subsequent peeling angle a2 is smaller than the initial peeling angle a1 and leftovers such as the adhesive or the like can be eliminated as much as possible.

Further, the peeling object of the peeling apparatus according to the present invention is not limited to the wafer W, but can be also applied to such cases as peeling off a sheet or the like from the peeling object where a sheet or a film is stuck.

The invention claimed is:

1. A sheet peeling apparatus comprising:
   a peeling table supporting a peeling object on which a sheet is stuck; and
   a sheet peeling unit provided to be movable relatively along a surface of the peeling object, in which the sheet can be peeled off in such a way that a peeling tape paid out from the sheet peeling unit is bonded to the sheet and the peeling tape is wound, wherein:
   said peeling unit includes a supply portion of the peeling tape, a winding portion of the peeling tape and a peeling head positioned between the supply portion and the winding portion,
   said peeling head comprises a first roll which affixes the peeling tape to the surface of the sheet, a second roll which is provided alongside the first roll across an aperture through which the sheet may travel, and a third roll which is provided downstream of the winding direction of the peeling tape relative to the second roll, and the first roll and the second roll form a first peeling angle and the first roll and third roll form a second peeling angle which is smaller than the first peeling angle, to peel off the sheet,
   wherein the peeling tape fits along an outer peripheral surface of the first roll when the first peeling angle is formed and the second peeling angle is determined by an outside diameter of the first roll.

2. The sheet peeling apparatus according to claim 1, wherein:
   said peeling object is a semiconductor wafer and said sheet is a protection sheet to protect a surface of the semiconductor wafer.

3. The sheet peeling apparatus according to claim 1, further comprising:
   a distance adjusting unit to adjust a relative distance between said peeling head and said peeling table, wherein:
   said distance adjusting unit, when said peeling head performs an initial peeling-off by moving the sheet from the end portion of the peeling object to an inner side thereof, maintains said peeling head at substantially the same relative distance as a distance set when said peeling head sticks said peeling tape on the sheet, and meanwhile, during the time between the completion of the initial peeling-off and the completion of the total peeling-off, said relative distance is enlarged to maintain said peeling head in a direction to separate from the peeling object.

4. A sheet roll peeling apparatus according to claim 1, wherein a support roll forms a first peeling angle by supplying the peeling tape during the relative movement of the peeling head and the peeling table, while contributing tension to the peeling tape by contributing rolling force in the opposite direction of the peeling tape feed direction.

5. A sheet peeling method in which a peeling tape is bonded to a sheet stuck on a surface of a peeling object so as to peel off said sheet comprising the steps of:

bonding the peeling tape to said sheet;

forming an initial peeling angle through bending the peeling tape in a direction to invert the peeling tape at a position of an end portion of the peeling object;

peeling off an end portion of the sheet from the end portion of the peeling object at said initial peeling angle; and peeling off said sheet while maintaining a subsequent peeling angle that is smaller than said initial peeling angle, wherein when the initial peeling angle is formed, a motor is driven so that the peeling tape fits along an outer peripheral surface of a roller and the subsequent peeling angle, determined by a diameter of the roller, is maintained and the sheet is peeled off to an opposite side end portion of the peeling object.

6. The sheet peeling method according to claim 5, wherein:

said peeling object is a semiconductor wafer and said sheet is a protection sheet to protect a surface of the semiconductor wafer.

7. A sheet peeling method, in which a sheet is stuck on a circuit plane of a semiconductor wafer having bumps formed thereon and a peeling tape is stuck to a sheet to peel off the sheet, comprising the steps of:

bonding said peeling tape to a position of an end portion of the wafer;

providing the peeling tape with tension force at a pay-out side in a direction opposite to a winding direction, while winding operation of the peeling tape is suspended;

forming an initial peeling angle through gradually paying out the peeling tape at a pay-out side to generate a slack and bend the peeling tape in a direction to invert the peeling tape; then winding the peeling tape at said initial peeling angle to peel off an end portion of the sheet; and subsequently, peeling off said sheet at a subsequent peeling angle that is smaller than the initial peeling angle by winding said folded part, wherein when the initial peeling angle is formed, a motor is driven so that the peeling tape fits along an outer peripheral surface of a roller and the subsequent peeling angle, determined by a diameter of the roller, is maintained and the sheet is peeled off to an opposite side end portion of the peeling object.

8. The sheet peeling method according to claim 5, 6 or 7, wherein:

said peeling head, in a state of maintaining a relative distance to impart a press force to the peeling object when sticking the peeling tape on the sheet, winds said peeling tape to perform an initial peeling-off of said sheet; and subsequently, said sheet is completely peeled off from the peeling object, in a state that said relative distance is enlarged to separate said peeling head from the peeling object.

* * * * *